United States Patent
Klein et al.

(10) Patent No.: US 9,316,675 B2
(45) Date of Patent: Apr. 19, 2016

(54) SECONDARY PLASMA DETECTION SYSTEMS AND METHODS

(71) Applicant: MKS Instruments, Inc., Andover, MA (US)

(72) Inventors: Jesse N. Klein, West Henrietta, NY (US); Richard Pham, San Jose, CA (US)

(73) Assignee: MKS Instruments, Inc., Andover, MA (US)

( * ) Notice: Subject to any disclaimer, the term of this patent is extended or adjusted under 35 U.S.C. 154(b) by 230 days.

(21) Appl. No.: 13/826,571

(22) Filed: Mar. 14, 2013

(65) Prior Publication Data

US 2014/0062305 A1    Mar. 6, 2014

Related U.S. Application Data

(60) Provisional application No. 61/697,518, filed on Sep. 6, 2012.

(51) Int. Cl.
*H01J 7/24* (2006.01)
*G01R 31/00* (2006.01)
*H01J 37/32* (2006.01)

(52) U.S. Cl.
CPC .............. *G01R 31/00* (2013.01); *H01J 37/32* (2013.01); *H01J 37/32183* (2013.01); *H01J 37/32935* (2013.01)

(58) Field of Classification Search
CPC combination set(s) only.
See application file for complete search history.

(56) References Cited

U.S. PATENT DOCUMENTS

| | | | | |
|---|---|---|---|---|
| 4,846,928 A * | 7/1989 | Dolins | .............. | H01J 37/32935 156/345.24 |
| 5,543,689 A * | 8/1996 | Ohta | .................. | H01J 37/32082 315/111.21 |
| 6,796,269 B2 * | 9/2004 | Sasaki | ............... | H01J 37/32935 118/712 |
| 7,115,210 B2 | 10/2006 | Calderoni et al. | | |
| 7,902,991 B2 * | 3/2011 | Park | .................. | H01J 37/32174 315/111.21 |
| 7,981,257 B2 | 7/2011 | Krauss et al. | | |
| 7,988,833 B2 | 8/2011 | Krauss | | |
| 8,558,460 B2 * | 10/2013 | Nonomura | ........ | H01J 37/32935 315/111.21 |
| 8,585,862 B2 * | 11/2013 | Mizukami | ......... | H01J 37/32091 118/712 |
| 2003/0127190 A1 | 7/2003 | Flugaur et al. | | |
| 2008/0074255 A1 * | 3/2008 | Park | .................. | H01J 37/32174 340/540 |
| 2008/0122369 A1 * | 5/2008 | Nitschke | ........... | H01J 37/32935 315/111.21 |
| 2009/0029489 A1 * | 1/2009 | Park | .................. | H01J 37/32935 438/9 |

(Continued)

*Primary Examiner* — Tung X Le
*Assistant Examiner* — Srinivas Sathiraju
(74) *Attorney, Agent, or Firm* — Harness, Dickey & Pierce, P.L.C.

(57) ABSTRACT

A system includes a control module, a detection module, and a reaction module. The control module is configured to receive a sensor signal indicating a power characteristic of an output power provided from a power generator to a load. The load is separate from the control module and the power generator. The detection module is configured to (i) detect a shift parameter of the power characteristic based on the sensor signal, (ii) compare the shift parameter to a first threshold, and (iii) indicate whether the shift parameter has exceeded the first threshold and not a second threshold. The reaction module is configured to indicate that a low-level abnormality exists in the load in response to the shift parameter exceeding the first threshold and not the second threshold.

28 Claims, 11 Drawing Sheets

(56) References Cited

U.S. PATENT DOCUMENTS

| | | |
|---|---|---|
| 2009/0173896 A1 | 7/2009 | Loeken et al. |
| 2010/0243470 A1* | 9/2010 | Nonomura ........ H01J 37/32935 205/641 |
| 2010/0245084 A1* | 9/2010 | Park ................. H01J 37/32183 340/540 |
| 2010/0258246 A1* | 10/2010 | Iwakoshi ............ H01J 37/3299 156/345.24 |
| 2011/0109530 A1* | 5/2011 | Nonomura ........ H01J 37/32935 345/60 |
| 2012/0074951 A1 | 3/2012 | Chen et al. |
| 2012/0075108 A1 | 3/2012 | Chen et al. |
| 2012/0109582 A1* | 5/2012 | Moriya ............. H01J 37/32935 702/183 |
| 2013/0056154 A1* | 3/2013 | Nakaya ............. H01J 37/32944 156/345.24 |
| 2014/0062305 A1* | 3/2014 | Klein ..................... G01R 31/00 315/111.21 |

\* cited by examiner

SECONDARY PLASMA DETECTION SYSTEMS AND METHODS

CROSS-REFERENCE TO RELATED APPLICATIONS

This application claims the benefit of U.S. Provisional Application No. 61/697,518, filed on Sep. 6, 2012. The entire disclosure of the above application is incorporated herein by reference.

FIELD

The present disclosure relates to power generators, and more particularly to systems for monitoring power characteristic irregularities at and/or downstream from the power generators.

BACKGROUND

This section provides background information related to the present disclosure which is not necessarily prior art.

Various industries use power generators to drive plasma chambers in order to fabricate various components such as integrated circuits, solar panels, compact disks (CDs), solid-state memory devices (e.g., magnetoresistive random access memory MRAM), digital versatile (or video) discs (DVDs), and the like. The power generators may be radio frequency (RF), direct current (DC) or alternating current (AC) generators.

Fabrication processes can vary depending upon the particular component being manufactured. Power generators used in the fabrication processes can provide RF energy, DC power, or AC power having certain characteristics. The characteristics may include frequency, power, current, voltage and/or other power characteristic. For each fabrication process one or more of the characteristics may be regulated.

SUMMARY

This section provides a general summary of the disclosure, and is not a comprehensive disclosure of its full scope or all of its features.

A system is provided and includes a control module, a detection module, and a reaction module. The control module is configured to receive a sensor signal indicating a power characteristic of an output power provided from a power generator to a load. The load is separate from the control module and the power generator. The detection module is configured to (i) detect a shift parameter of the power characteristic based on the sensor signal, (ii) compare the shift parameter to a first threshold, and (iii) indicate whether the shift parameter has exceeded the first threshold and not a second threshold. The reaction module is configured to indicate that a low-level abnormality exists in the load in response to the shift parameter exceeding the first threshold and not the second threshold.

In other features, a power generator is provided and includes a generator circuit, a control module, a detection module and a reaction module. The generator circuit is configured to generate an output power to power a plasma chamber and supply the output power from the power generator to the plasma chamber. The control module is configured to receive a sensor signal indicating a power characteristic of the output power provided from the generator circuit to the plasma chamber. The detection module is configured to (i) detect a shift parameter of the power characteristic based on the sensor signal, and (ii) indicate whether the shift parameter has exceeded a threshold associated with secondary plasma in the plasma chamber. The reaction module is configured to indicate that a low-level abnormality exists in the plasma chamber in response to the shift parameter exceeding the threshold.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected implementations and not all possible implementations, and are not intended to limit the scope of the present disclosure. The present disclosure will become more fully understood from the detailed description and the accompanying drawings, wherein.

Corresponding reference numerals indicate corresponding parts throughout the several views of the drawings.

DETAILED DESCRIPTION

Excursions, such as arcs, micro-arcs, and/or other plasma instabilities, can occur during a fabrication process within a plasma chamber. An arc event can occur due to a short or low-impedance at or downstream from an output of a power generator. The short may occur between power lines providing power to the plasma chamber, between components and/or parts in the plasma chamber, or between other devices between the power generator and electrodes of the power chamber. An arc event can occur, for example, between: electrodes in the plasma chamber; an electrode and a substrate (or part being worked on); an electrode and a component and/or wall of the plasma chamber; and/or components of the plasma chamber. An arc event can cause: an output voltage of the power generator to decrease to zero; current out of the power generator to rapidly increase; and impedance of a load downstream from the power generator to decrease.

Figure 1:
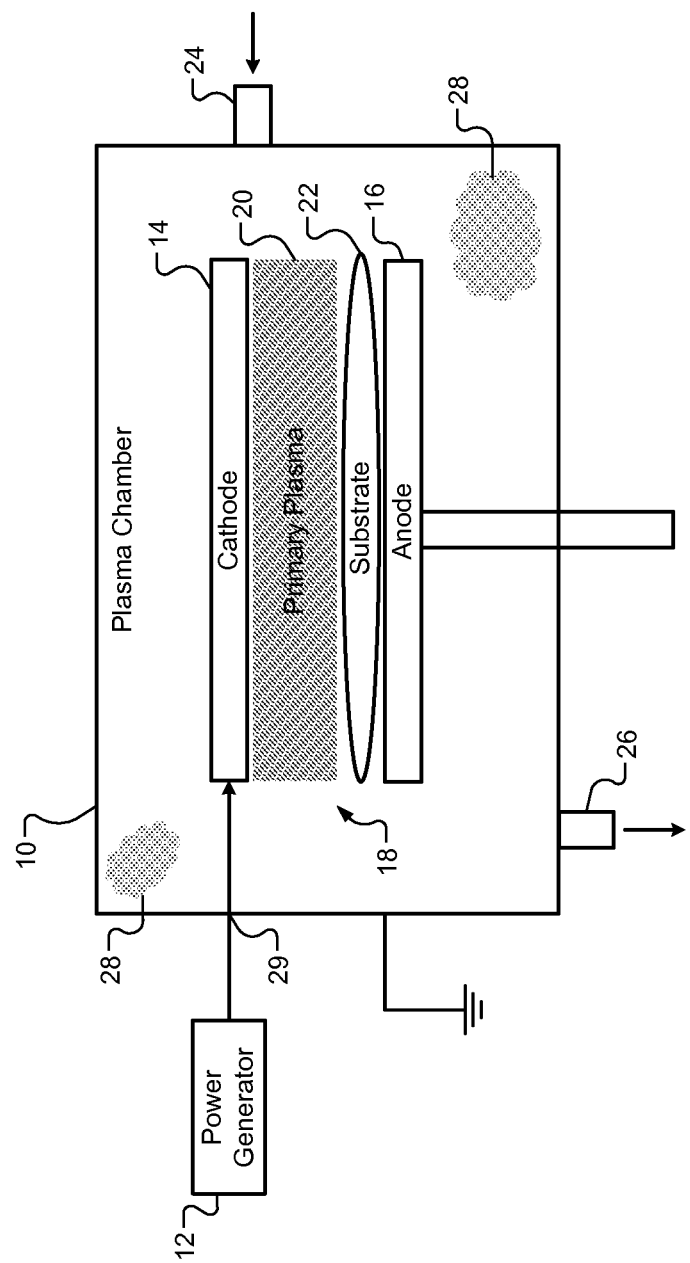
FIG. 1 is a functional block diagram of a traditional plasma chamber.

In FIG. 1, a plasma chamber 10 is shown. The plasma chamber 10 is a load that is downstream from a power generator 12 and may include electrodes such as a cathode 14 and an anode 16. An area 18 (referred to as a main chamber cavity) is located between the electrodes 14, 16. A primary plasma 20 is disposed in the area 18 between the electrodes 14, 16. A substrate 22 is disposed on the anode 16 and between the primary plasma 20 and the anode 16. Gas(es) are received at a gas inlet 24 and directed out of the plasma chamber 10 at a gas outlet 26. Power is supplied from the power generator 12 to an input 29 of the plasma chamber 10 and then to the cathode 14. The power generator 12 may be a RF power generator, a DC power generator or an AC power generator. An example DC power generator is an asymmetric bipolar pulsed DC generator.

During operation, current is discharged through the primary plasma 20 between the electrodes 14, 16 to perform, for example, plasma etching, plasma enhanced chemical vapor deposition (PECVD), or physical vapor deposition (PVD) on the substrate 22. Arc events and/or power characteristic irregularities can occur in the plasma chamber 10 due to secondary plasma 28 located in the plasma chamber 10 and away from the area 18 between the electrodes 14, 16.

Secondary plasma arises due to a buildup of charge(s) in gas(es) and/or particles between potential surfaces within the plasma chamber 10. The gas(es) and/or particles become ionized and create the secondary plasma. The secondary plasma diverts some energy away from the area 18 between the electrodes 14, 16 resulting in power characteristic irregularities at the input 29. The current may be diverted away from the primary plasma 20 and may pass between the electrodes 14, 16 and/or from one of the electrodes 14, 16 to other components and/or walls of the plasma chamber 10. The power characteristic irregularities can include shifts or changes in frequency, power, impedance, voltage and/or current at the electrodes 14, 16 and at the input 29.

The secondary plasma can cause issues with: particles; uniformity; and/or film thickness repeatability on the substrate 22. In a DC application, an amount of material deposited or an overall deposition rate is affected by changes in voltage and current levels associated with the presence of secondary plasma. As a result, an impedance shift due to the presence of the secondary plasma changes expected end results of a fabrication process. The secondary plasma can also cause back sputtering onto walls of the plasma chamber 10. This can lead to flaking of the walls resulting in particle debris in the plasma chamber 10 and/or on the substrate 22.

As disclosed herein, the power characteristic irregularities due to secondary plasma and/or other abnormalities can be seen and detected at, for example, the input 29 of the plasma chamber 10. The power characteristic irregularities due to presence of secondary plasma are typically less in magnitude than power characteristic irregularities due to high-level abnormalities, such as shorts or other low-impedance arc events. The power characteristic irregularities due to the presence of secondary plasma are typically greater in magnitude than "normal" or expected power characteristic changes that occur at a standard rate over time. The expected power characteristic are not typically greater in magnitude than magnitudes of power characteristic changes due to abnormalities (e.g., low-impedance arcing and secondary plasma) in the plasma chamber. Power characteristic changes can occur over time due to, for example, physical changes in the plasma chamber. These physical changes may include, for example, changes in material composition and/or temperature of components of the plasma chamber and/or changes due to "wear and tear" associated with power generator operation over time.

Figure 2:
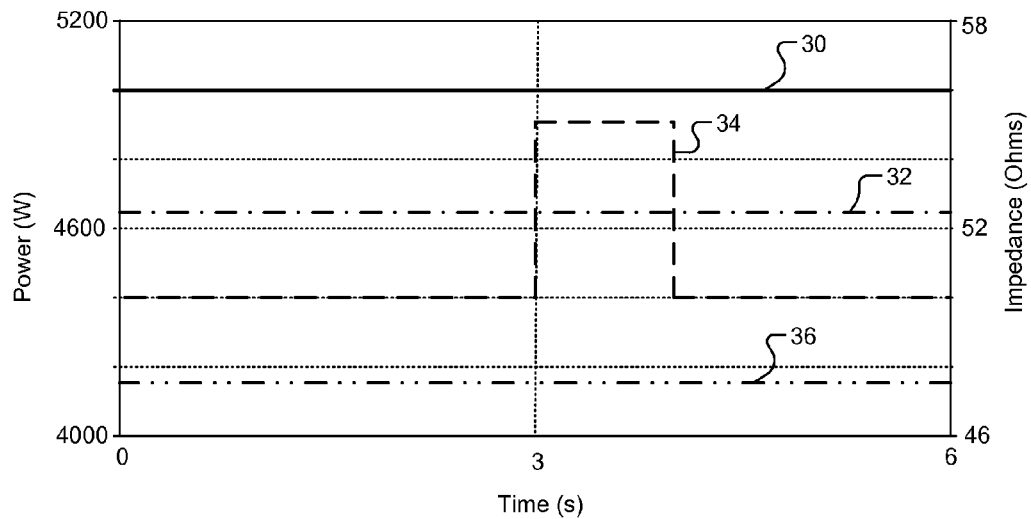
FIG. 2 is a power and impedance plot illustrating characteristic changes including impedance changes in a first direction due to presence of secondary plasma.
Figure 3:
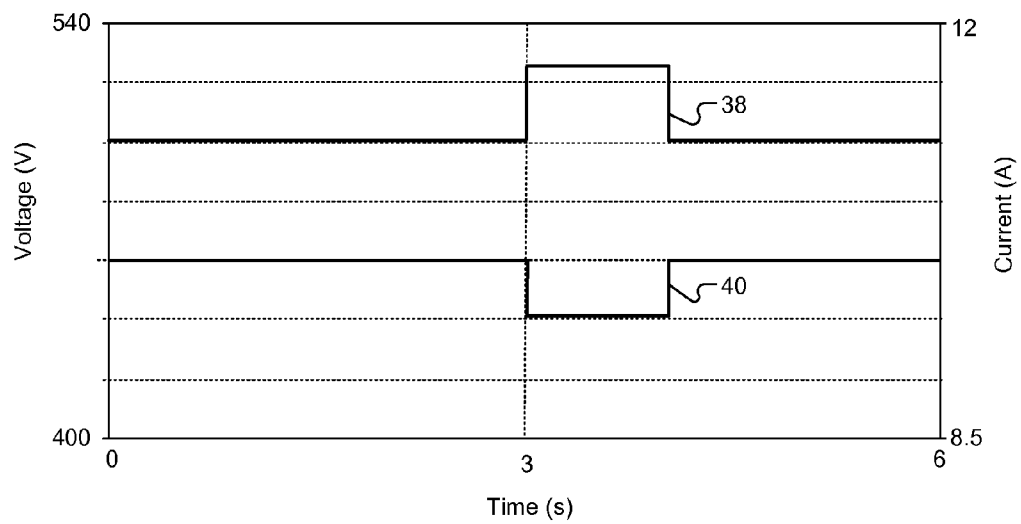
FIG. 3 is a voltage and current plot corresponding to the power and impedance plot of FIG. 2.

Power characteristic irregularities can occur in positive or negative directions, as illustrated by FIGS. 2-5. Output power of a power generator may have associated baseline setpoints. The baseline setpoints may include frequency, power, voltage, current and/or impedance setpoints. For example, baseline setpoints may include a 5 kilo-watt (kW) power setpoint, a 500 volt (V) voltage setpoint, a 10 ampere (A) current setpoint, and a 50 ohm (Ω) impedance setpoint. As a result of the presence of secondary plasma, power characteristic shifts may occur including for example: the voltage increasing to 525 V (a magnitude shift of 25 V); the current decreasing to 9.52 A (a magnitude shift of 0.38 A); and the impedance increasing to 55 Ω (a magnitude shift of 5 Ω). These are shifts of 10% from the baseline setpoints. These shifts are illustrated in FIGS. 2 and 3.

In FIGS. 2 and 3, a power and impedance plot and a voltage and current plot are shown. In the example of FIGS. 2 and 3, power is regulated and for this reason the power remains at a constant level, as shown by power signal 30. The impedance increases and may exceed a predetermined upper limit 32, as shown by the impedance signal 34. The predetermined upper limit 32 and a predetermined lower limit 36 may be set to detect a shift in impedance due to the abnormality. In FIG. 3, voltage and current shifts are shown by respective voltage and current signals 38, 40.

The power characteristic shifts may occur in the opposite direction. For example the voltage may decrease to 470 V (a magnitude shift of 30V); the current may increase to 10.66 A (a magnitude shift of 0.66 A); and the impedance may decrease to 44 Ω (a magnitude shift of 6 Ω). These are shifts of −12% from the baseline setpoints. The power characteristic shifts are illustrated in FIGS. 4 and 5.

Figure 4:
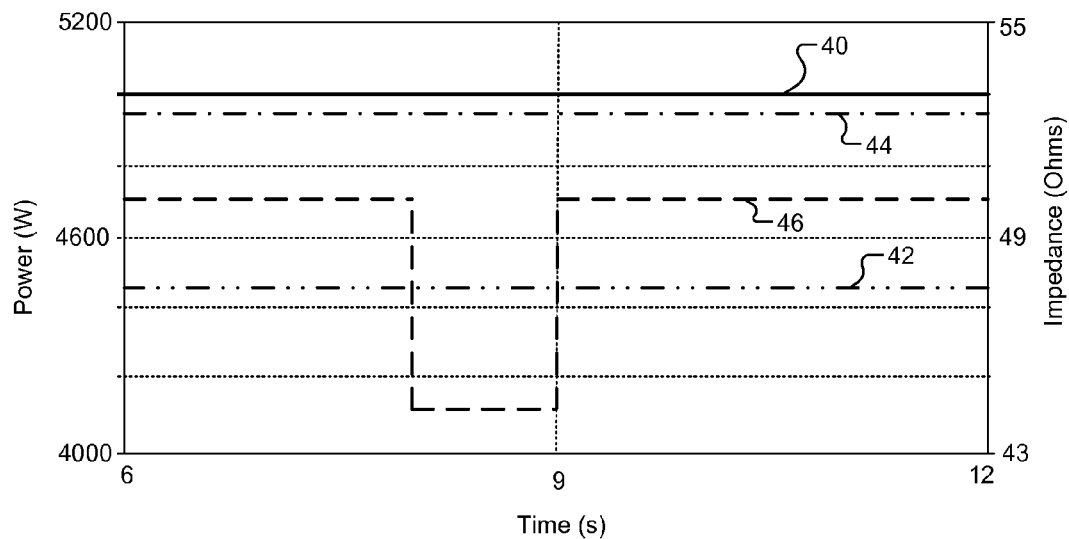
FIG. 4 is another power and impedance plot illustrating characteristic changes including impedance changes in a second direction due to presence of secondary plasma.
Figure 5:
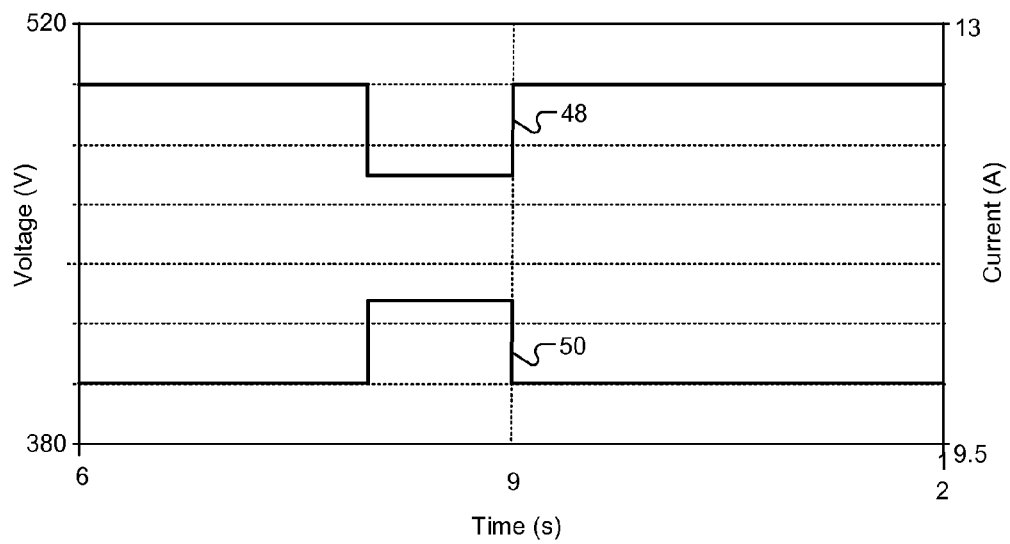
FIG. 5 is a voltage and current plot corresponding to the power and impedance plot of FIG. 4.

In FIGS. 4 and 5, a power and impedance plot and a voltage and current plot are shown. In the example shown, power is regulated and for this reason the power remains at a constant level, as shown by a power signal 40. The impedance decreases and may exceed the predetermined lower limit 42 and not an upper limit 44, as shown by an impedance signal 46. In FIG. 5, voltage and current shifts are shown by respective voltage and current signals 48, 50.

The power characteristic shifts of FIGS. 2-5 do not exceed arc event thresholds, but as shown may exceed predetermined limits. The predetermined limits may be associated with the presence of secondary plasma and/or other low-level abnormalities, such as abnormalities in a substrate (or part being worked on) and/or in plasma chamber components. Low-level abnormalities refer to abnormalities that divert current away from the area between the electrodes of a load and cause smaller magnitude changes in power characteristics than caused by high-level abnormalities.

Although low-level abnormalities may include arcing, the arcing may be referred to as a high-impedance arc event, as the current diverted and/or drawn due to the arcing is less than that associated with low-impedance arc events. The arc event thresholds for low-impedance arc events are greater in magnitude than the predetermined limits used to detect the low-level abnormalities. Arc event thresholds and low-level abnormality limits may be set, adjusted and used by the below-described power generation systems.

Example disclosed implementations are further described with reference to the accompanying drawings.

Figure 6:
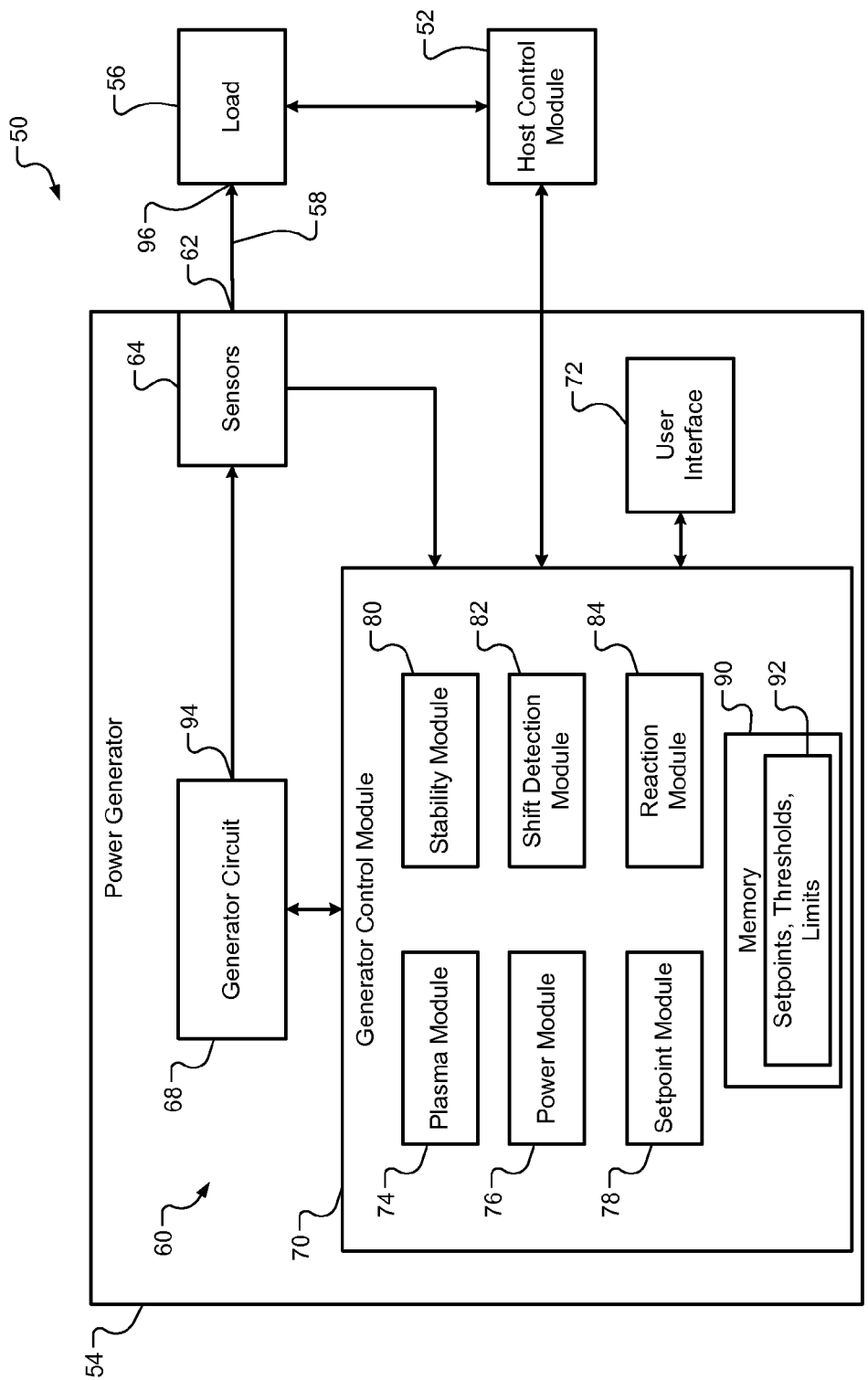
FIG. 6 is a functional block diagram of a power generator system including power characteristic irregularity monitoring at and/or downstream from a power generator and in accordance with the present disclosure.

In FIG. 6, a power generator system 50 is shown and includes a host control module 52, a power generator 54 and a load 56. The host control module 52 may be connected to and/or be in communication with the power generator 54 and the load 56. The host control module 52 may be separate from, located remotely from, and control operation of the power generator 54 and/or the load 56. The host control module 52 may control operation of the plasma chamber 10 based on signals from the power generator 54. The power generator 54 may be a RF, DC, or AC power generator and supply RF, DC or AC power to the load 56 via one or more power lines 58. As an example for a RF application, the power provided from the power generator 54 to the load 56 may be 2.5-10 kilowatts (kW). The load 56 may be, for example, a plasma chamber 10 or other load configured to receive RF, DC or AC power.

The power generator 54 includes a monitoring system 60 that monitors power characteristic irregularities at and/or downstream from the power generator 54. Although the monitoring system 60 is shown as monitoring power characteristic irregularities at an output 62 of the power generator 54, the monitoring system 62 may monitor power characteristic irregularities downstream from and/or seen by the power generator 54. For example, sensors 64, for detecting the power characteristic irregularities, may be located downstream from the power generator 54 and/or at the load 56 and feedback signals 66 to the power generator 54.

The monitoring system 60 includes a generator circuit 68, a generator control module 70 and the sensors 64. The generator circuit 68 generates the power supplied to the load 56. The generator circuit 68 may include, for example, drivers, power amplifiers, power combiners, impedance matching networks, etc. The generator control module 70 controls operation of the generator circuit 68 based on signals received from the sensors 64. The generator control module 70 may set, monitor and/or adjust setpoints of the generator circuit 68. The setpoints may include frequency, power, voltage, current, impedance, and/or other generator circuit setpoints. The generator control module 70 may also set, monitor, and/or adjust other setpoints including power characteristic setpoints, thresholds, limits, and/or other setpoints of the generator circuit 68.

The setpoints, thresholds and/or limits may be predetermined, determined during operation of the power generator 54, adjusted by the host control module 52, and/or manually adjusted via a user interface 72. The user interface 72 may include, for example, a touch screen, a keypad, a wired or wireless interface, a mouse, and/or other data entry device, input device, and/or industrial bus. The setpoints, thresholds and/or limits may be used to detect arc events and low-level abnormalities.

The generator control module 70 may include a plasma module 74, a power module 76, a setpoint module 78, a stability module 80, a shift detection module 82, and/or a reaction module 84. The plasma module 74 monitors, determines and/or estimates a status of primary plasma within a plasma chamber of the load 56. The plasma module 74 may determine whether the primary plasma has been supplied with power (or striked) and/or is lit. The power module 76 may monitor and/or determine (i) whether output power of the power generator 54 is enabled and/or (ii) whether the power generator 54 is supplying power to the load 56.

The setpoint module 78 may set, store, and/or adjust the setpoints of the generator circuit 68 and/or the generator control module 70. The setpoints may be stored in memory 90. The memory 90 may be located in the generator control module 70 and/or may be separate from the generator control module 70. The modules 70, 74-84, the user interface 72, and/or the host control module 52 may have access to the memory 90 and/or setpoints, thresholds and/or limits 92 stored in the memory 90.

The stability module 80 waits for power characteristics monitored by the monitoring system 60 to stabilize. The stability module 80 may wait for the power characteristics to stabilize upon power being provided from the power generator 54 to the load and/or upon changes in one or more of the setpoints. The shift detection module 82 detects, monitors, and tracks changes (or shifts) in the power characteristics. The reaction module 84 reacts to changes in the power characteristics and/or parameters generated based on the changes in the power characteristics. Operation of the modules 70, 74-84 is further described below with respect to FIGS. 8-10D.

The sensors 64 may be located within the power generator 54 as shown and/or may be located downstream from the power generator 54. For example, the sensors 64 may be located between the power generator 54 and the load 56 and may monitor power characteristics of the power lines 58 connected between the power generator 54 and the load 56. The sensors 64 may be connected directly to: a power output 94 of the generator circuit 68; the power output 62 of the power generator 54; and/or a power input 96 of the load 56. The sensors 64 may include frequency, power, voltage, current, and/or impedance sensors.

Figure 7:
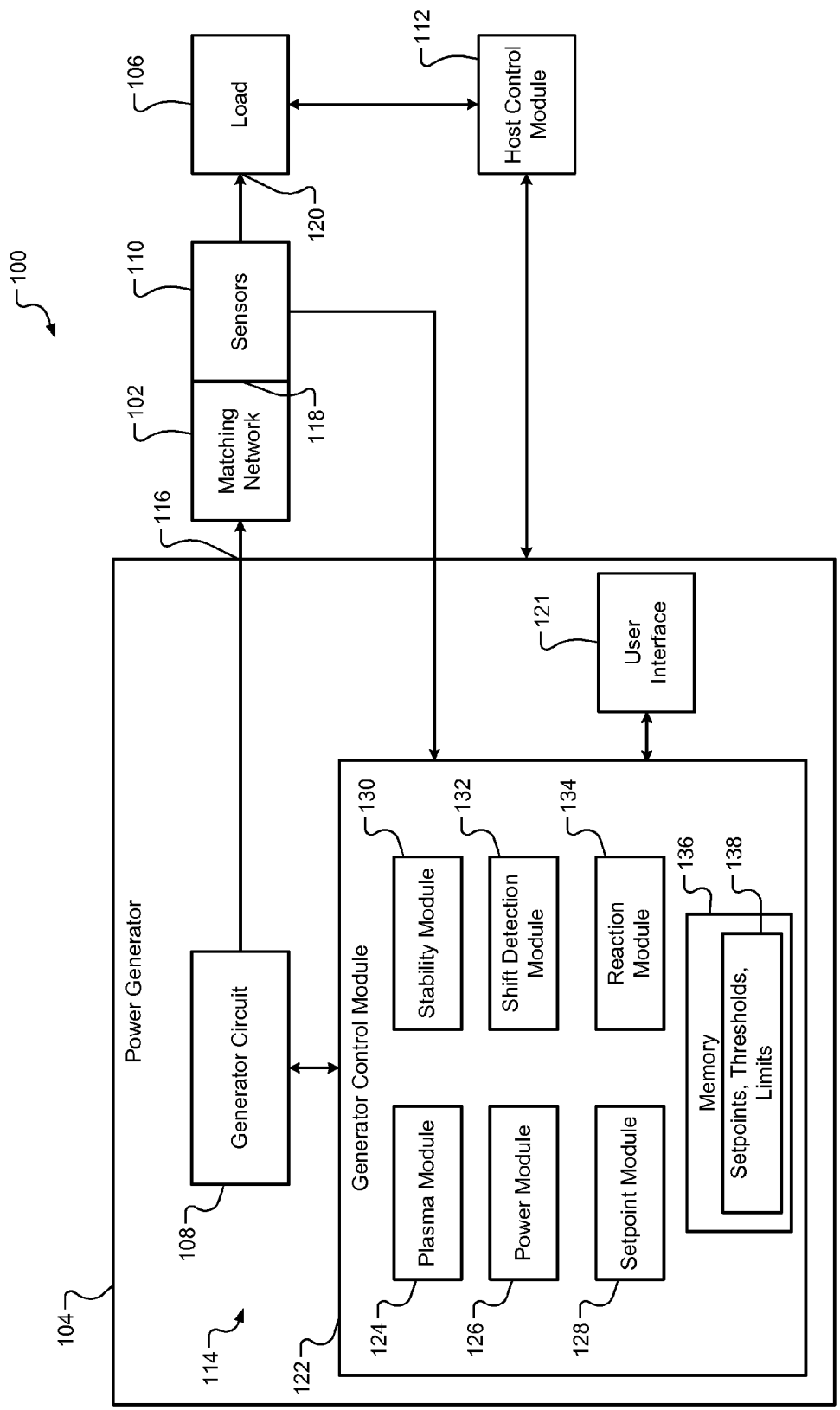
FIG. 7 is a functional block diagram of a power generator system including power characteristic irregularity monitoring at and/or downstream from a matching network and in accordance with the present disclosure.

In FIG. 7, a power generator system 100 is shown. The power generator system 100 is similar to the power generator system 50 of FIG. 6. The power generator system 100 includes a matching network 102. The matching network 102 matches impedances between a power generator 104 and a load 106. The matching network 102 is located between a generator circuit 108 of the power generator 104 and the load 106. The matching network 102 may be located between the generator circuit 108 and sensors 110 or between the sensors 110 and the load 106. The matching network 102 may be located within or may be external to the power generator 104, as shown. The power generator 104 may be a RF, DC, or AC power generator and supply RF, DC or AC power to the load 106.

The power generator system 100 includes a host control module 112 and a monitoring system 114 that monitors power characteristic irregularities at and/or downstream from the power generator 104. Although the monitoring system 114 is shown as monitoring power characteristic irregularities downstream from the power generator 104 and the matching network 102, the monitoring system 114 may monitor power characteristic irregularities at an output 116 of the power generator 104 and/or an output 118 of the matching network 102. For example, the sensors 110 may be located between the power generator 104 and the matching network 102. The sensors 110 may be directly connected to the output 118 and/or directly to a power input 120 of the load 106. One or more of the sensors 110 may be included in the matching network 102. Regardless of the location of the sensors 110, sensor signals generated by the sensors 110 are used to determine conditions within the load 106 including power characteristics and/or existence of a high-level or low-level abnormality.

The monitoring system 114 includes the sensors 110, a user interface 121, the generator circuit 108, and a generator control module 122. The generator circuit 108 generates the power supplied to the load 106. The generator circuit 108 may include, for example, drivers, power amplifiers, power combiners, impedance matching networks, etc. The generator control module 122 controls operation of the generator circuit 108 based on signals received from the sensors 110. The generator control module 122 may set, monitor and/or adjust setpoints, thresholds, and/or limits similar to the generator control module 70 of FIG. 6. The generator control module 122 may include a plasma module 124, a power module 126, a setpoint module 128, a stability module 130, a shift detection module 132, and/or a reaction module 134. The modules 122-134 may operate similar to the modules 70, 74-84 of FIG. 6. The generator control module may include memory 136 with setpoints, thresholds, and limits 138. Operation of the modules 122-134 is further described below with respect to FIGS. 8-10D.

Figure 8:
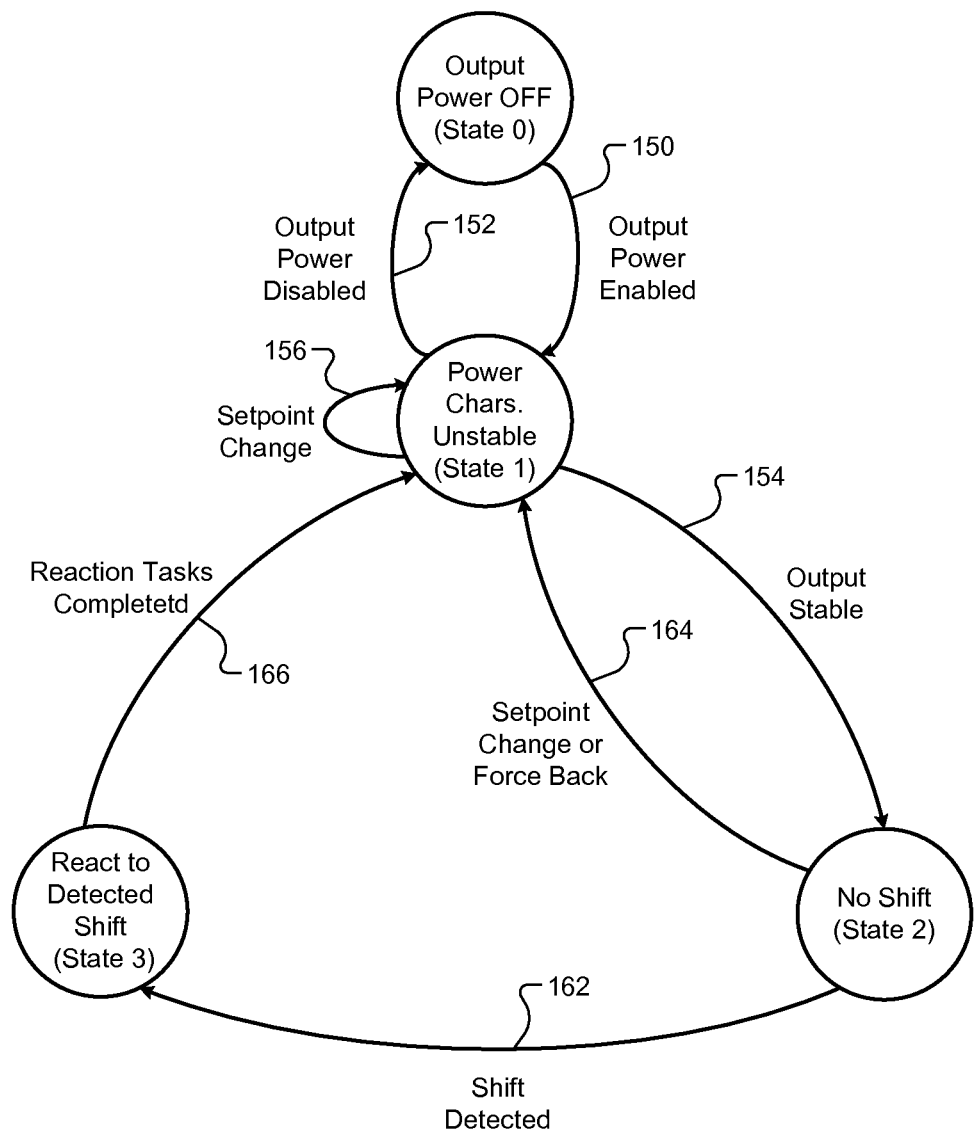
FIG. 8 is a state diagram illustrating a method of operating a power generator system in accordance with the present disclosure.

In FIG. 8, a state diagram illustrating a method of operating a power generator system (e.g., one of the power generator systems 50, 100 of FIGS. 6-7) is shown. Although the following tasks are primarily described with respect to FIG. 6, the tasks may be applied to the implementation of FIG. 7 and/or other implementations of the present disclosure. The state diagram is now described with respect to the power generator system 50. The state diagram includes different states of the power generator system 50. The states include State 0, State 1, State 2, and State 3. State 0 refers to when power out of the generator circuit 68 and/or the power generator 54 is disabled (or OFF). State 1 refers to when the power out of the generator circuit 68 and/or the power generator 54 is enabled (or ON) and the output power and/or other power characteristic(s) are unstable. Transitions between States 0 and 1 are shown by arrows 150, 152.

State 2 refers to when the power characteristics are stable and the generator control module 70 and/or the shift detection module 82 is monitoring for shifts in one or more power characteristic(s). The generator control module 70 transitions from State 2 to State 3 when a shift is detected that satisfies certain criteria indicating a low-level abnormality exists. State 3 refers to when a shift in a power characteristic indicating a low-level abnormality has been detected and the reaction module 84 is performing tasks in response to the shift.

In state 1, the stability module 80 executes a stability algorithm and waits for plasma and/or other items and/or conditions in the load 56 to stabilize. Power characteristics may be stable when conditions in the load 56 are stable. This may be performed using various techniques. In one implementation, the stability module 80 waits for the primary plasma in the load to become lit. The plasma module 74 may use an algorithm to determine whether the plasma is lit. For example, the plasma module 74 may determine whether current supplied to the primary plasma is greater than a predetermined current threshold. If the current supplied is greater than the predetermined current threshold, than the plasma is lit.

The stability module 80 may wait a predetermined amount of time after the plasma is lit to assure that the power characteristics are stable. Transition from State 1 to State 2 is shown by arrow 154. In another implementation, the stability module 80 waits for certain power characteristics to reach predetermined thresholds, such as an impedance as seen by the sensors 64 to reach a predetermined impedance threshold. The stability module 80 may wait for the power characteristics to reach the predetermined thresholds within a first predetermined period and/or to remain at the predetermined thresholds and/or setpoints for a second predetermined period. The power characteristics may be determined to be stable when the power characteristics reach the predetermined thresholds within the first predetermined period and/or when the power characteristics remain at the predetermined thresholds and/or setpoints for the second predetermined period. This allows the generator control module 70 to determine whether selected power characteristics are stable based on corresponding setpoints.

If one of the setpoints is changed, the stability module 80 may again execute the stability algorithm to assure that the power characteristics are stable. This is illustrated by arrow 156. If the power characteristics are stable, the generator control module 70 transitions to state 2.

Figure 9:
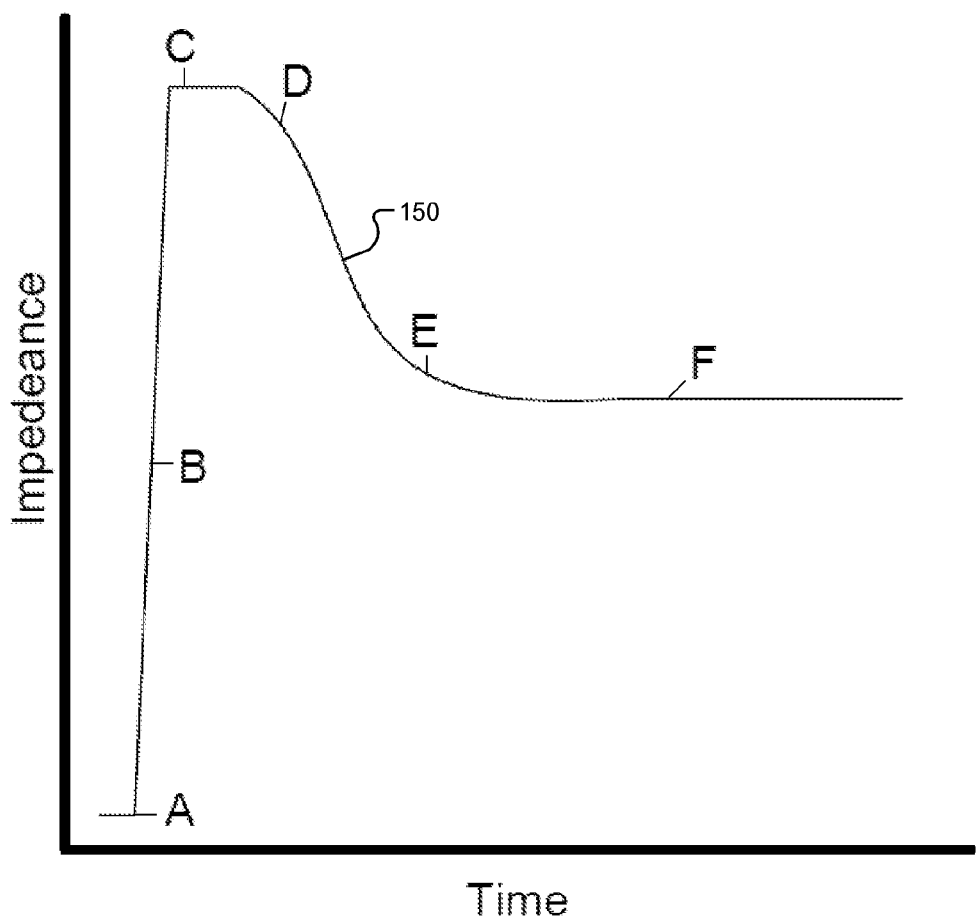
FIG. 9 is an impedance plot illustrating plasma striking, igniting and settling impedances.
Figure 10A:
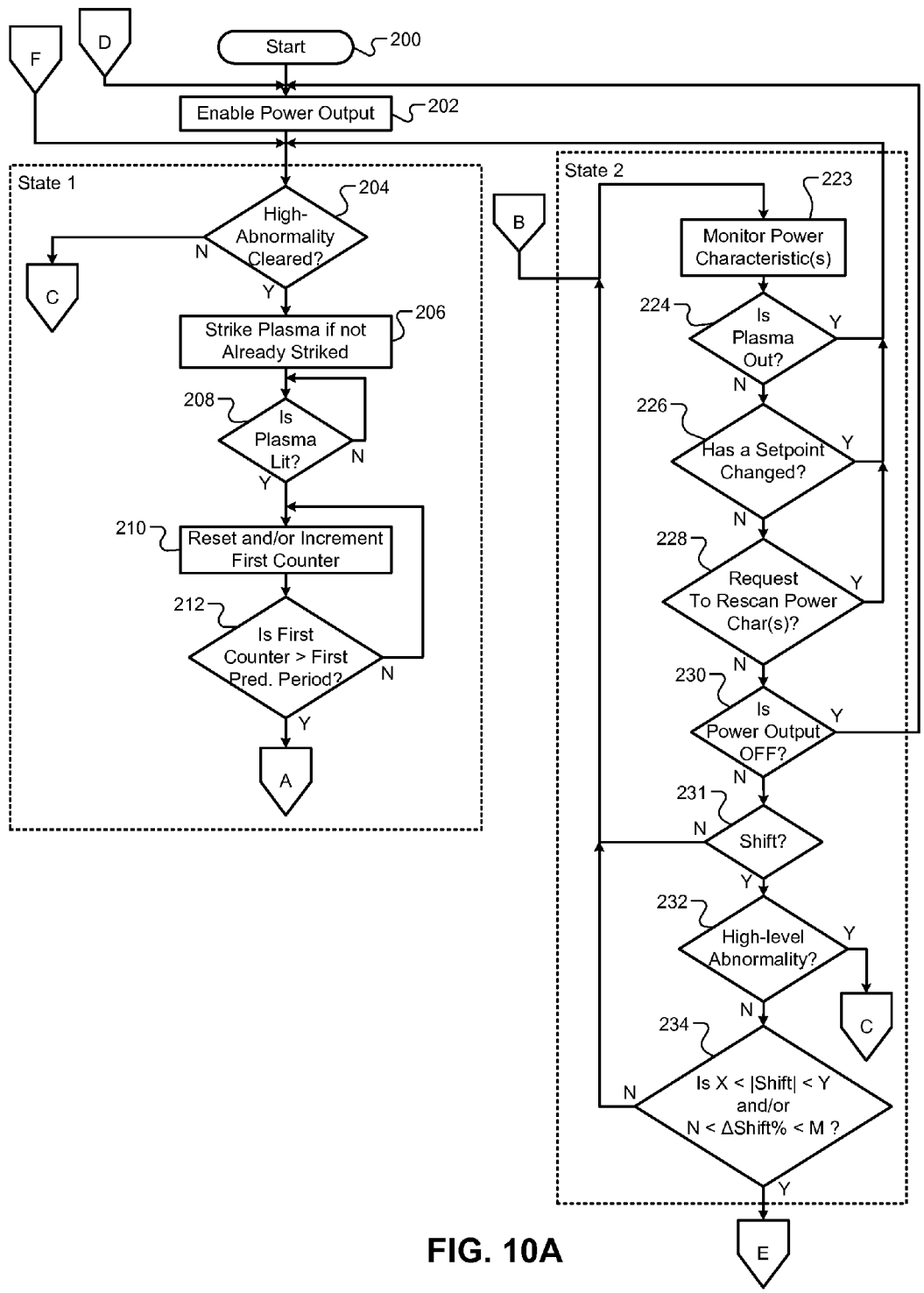
FIGS. 10A-10D illustrate a method of operating a power generator system including automatic and manual modes in accordance with the present disclosure.
Figure 10B:
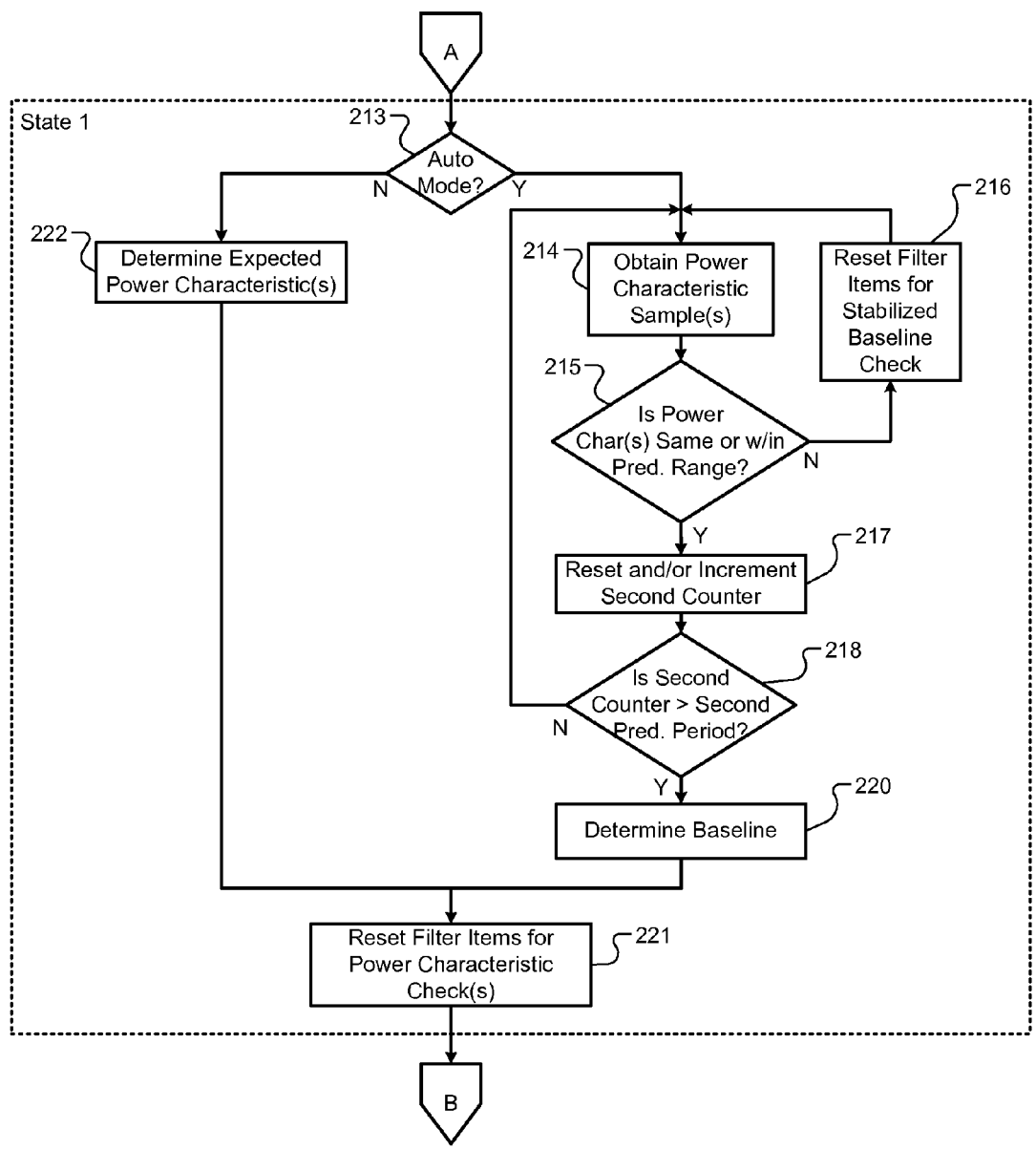
Figure 10C:
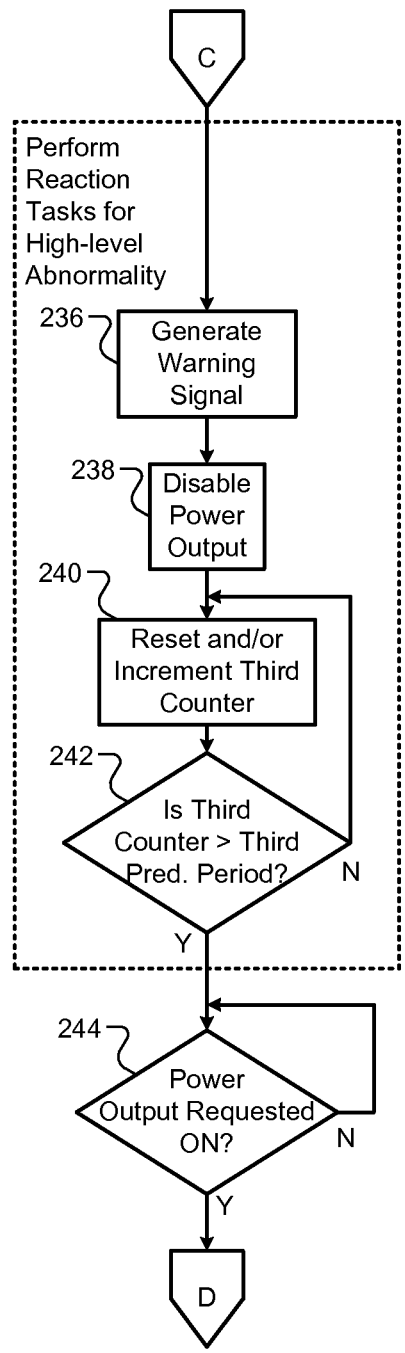
Figure 10D:
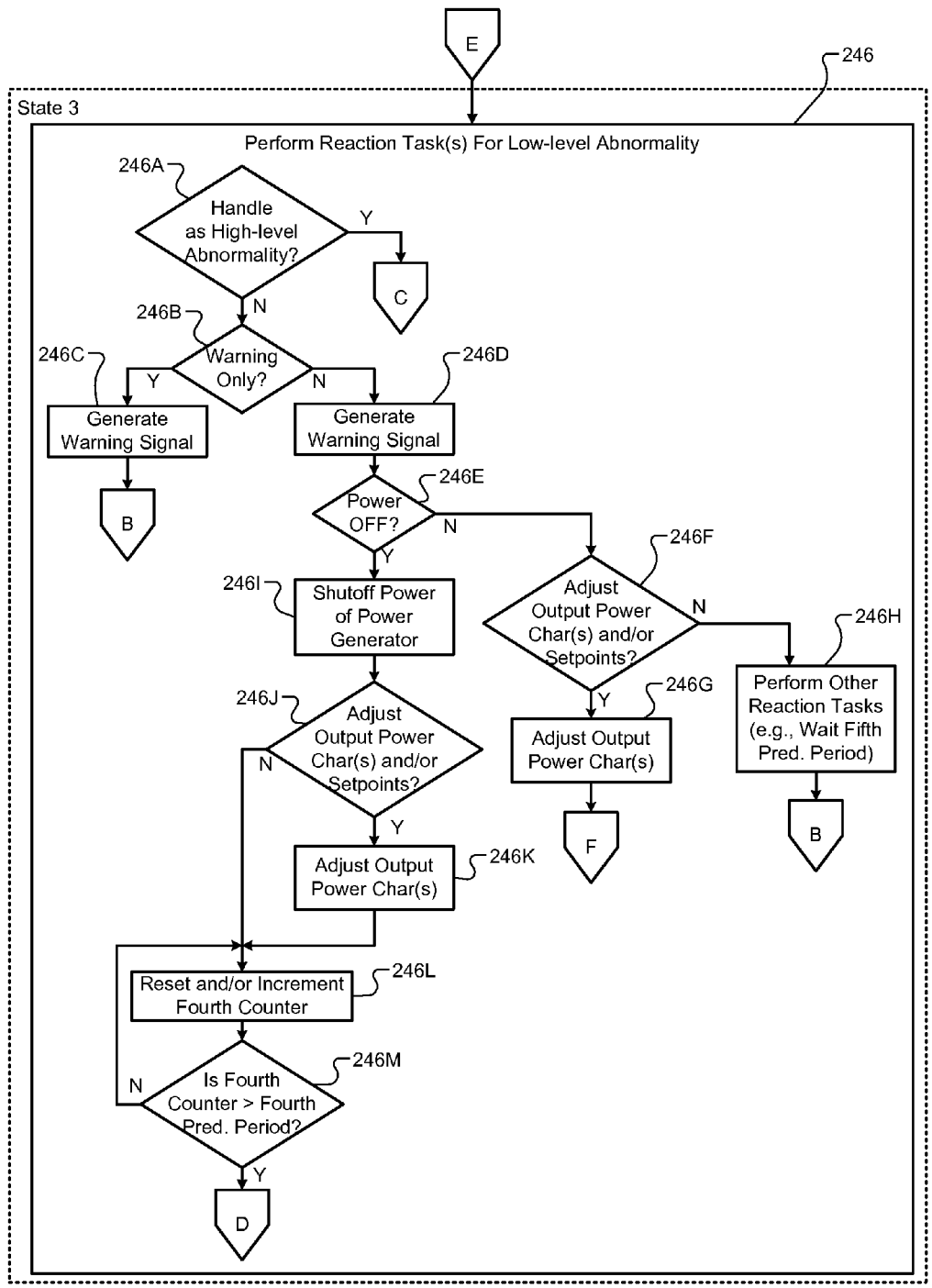

Referring now also to FIG. 9, an impedance plot is shown illustrating plasma striking, igniting and settling impedances. The impedance plot includes an impedance signal 160. The impedance signal 160 may be from, for example, one of the sensors 64. The impedance signal 160 has six states A-F. At state A, the power output 94 of the generator circuit 68 is enabled and the impedance begins to increase. At state B, the impedance rapidly increases as the generator circuit 68 starts to drive the load 56 to strike the primary plasma. At state C, the impedance is at a high impedance plateau and the generator circuit 68 is providing the power, voltage and/or current to strike the primary plasma.

At state D, the primary plasma is striked and the impedance starts to decrease. At state E, the impedance decreases to a stable impedance. At state F, the impedance is at the stable impedance and the plasma chamber or load 56 is void of low-level and high-level abnormalities. State 2 is initiated subsequent to state E and during state F. The stability module 80 may monitor the impedance to determine whether the impedance is at a predetermined level associated with state F.

In state 2, the shift detection module 82 executes a shift algorithm to detect one or more shifts in the power characteristics and/or to monitor one or more shift parameters. The shift parameters may include the shifts in the power characteristics and shift percentages of the power characteristics. The detected shifts may be associated with low-level abnormalities and/or high-level abnormalities. If a shift associated with a low-level abnormality and/or a high-level abnormality is detected, the generator control module 70 may transition from State 2 to State 3. This is shown by arrow 162. The shift algorithm may include various techniques for detecting the shifts.

The shift detection module 82 may determine a "normal", stable, or baseline impedance (referred to as a reference impedance). The shift detection module 82 may then detect when a measured (or detected) impedance shifts from the reference impedance by a predetermined amount such that a low-level abnormality is detected. The shift detection module 82 may monitor a shift percentage (e.g., shift amount divided by the reference impedance) and determine when the shift percentage exceeds a predetermined shift percentage associated with a low-level abnormality. The shift and/or shift percentage may be less than that associated with low-impedance arc events and greater than that associated with normal slow impedance changes over time. High and/or low limits may be set to detect shifts in impedances and/or shift percentages.

In another implementation, an expected impedance is provided to the generator control module 70 via, for example, the user interface 72 and/or the host control module 52. The shift detection module 82 may then determine whether the measured impedance is different than the expected impedance by a predetermined amount and/or whether a shift percentage associated with the expected and measured impedances is greater than the predetermined shift percentage.

As an alternative to or in addition to monitoring impedance, other power characteristics, such as power, voltage, and/or current shifts and/or corresponding shift percentages may be used to detect low-level abnormalities. Detecting low-level abnormalities based on shifts in power, voltage, and/or current can be regulation mode specific. For example, output power of the power generator 54 may be regulated to a predetermined power level. As a result, the power output 62 may not change due to a low-level abnormality. For this reason, if the power generator 54 is operating in a power regulation mode, the shift detection module 82 may not monitor for shifts in power, but may rather monitor other power characteristic(s). Impedance monitoring may be used regardless of the regulation mode, as a power generator typically regulates power, current and/or voltage.

As an example, a DC power generator system may have a power setpoint of 4 kW with a nominal chamber impedance of 25 Ω and output voltage of 316.2 V and an output current of 12.65 A. Due to secondary plasma formation, the impedance detected by the DC power generator system may be 28 Ω. This is a 3 Ω shift. Due to power regulation, the output power may remain at 4 kW, the voltage output shifts to 334.7 V, and the current output shifts to 11.95 A. As a result, the impedance, voltage and current have shifted more than a predetermined shift percentage of 7%. Note that the impedance has shifted a higher percentage than the voltage and current. For this reason, impedance may be used as a better indicator of a low-level abnormality than current and/or voltage. In this example, State 3 may be performed due to the predetermined shift percentage being exceeded.

The shift detection module 82 may also monitor secondary parameters, such as a length of time for which a shift occurred, a speed at which the shift occurred, and/or other suitable secondary parameters. For example, when a shift occurs within a predetermined period, then the shift detection module 82 may detect existence of a low-level abnormality. As another example, if the speed (or rate) at which the shift occurred is greater than a predetermined rate, then the shift detection module 82 may detect existence of a low-level abnormality. The secondary parameters may be monitored to prevent false detection low-level abnormalities.

In State 3, the reaction module 84 may execute a reaction algorithm to respond to the shift(s) detected while in State 2. The reaction module 84 may have a predefined set of tasks to perform, which may be configurable. The tasks may be configured by the host control module 52, the generator control module 70, a user via the user interface 72, and/or the reaction module 84.

The reaction module 84 where responding to a low-level abnormality may perform a series of reaction tasks similar to that performed when a high-level abnormality exists. This may include for example: reporting a warning to a user via the user interface 72; reporting a warning to the host control module 52; disabling output power of the power generator 54; generating a fault to disable the output power; and/or disabling the output power for a predetermined period and then enabling the output power to allow plasma in the load 56 to recover followed by returning to State 1.

In response to detecting the low-level abnormality, the reaction module 84 may perform other tasks such as adjusting output power regulation setpoints, thresholds, and/or limits, such as frequency, power, voltage, and/or current setpoints, thresholds, and/or limits. Adjustments in the setpoints may be performed to remove the low-level abnormality in the load and limit impurities and imperfections that occur due to the changes in the power characteristics. One or more of the setpoints may be adjusted by performing a sequence of tasks to decrease energy out of the power generator 54 to a level equal to an energy output of the power generator 54 prior to the shift and/or existence of the detected low-level abnormality.

The generator control module 70 may transition from State 2 to State 1 when a setpoint, threshold, and/or limit is adjusted. The generator control module 70 may also transition from State 2 to State 1 upon request by the generator control module 70, a module of the generator control module 70, the user interface 72 and/or the host control module 52. This is referred to as a force back. Transition from State 2 to State 1 is shown by arrow 164.

After each of the above-stated reactions, the generator control module may return to State 1 if the output power was not turned OFF and to State 0 if the output power was turned OFF. Returning to State 1 allows the power characteristics to settle back to nominal states prior to the low-level abnormality. Time spent in State 1 subsequent to the low-level abnormality may depend on: the tasks performed in response to the detected low-level abnormality; the tasks to be performed while in State 1; and/or the stability of the power characteristics. If State 1 is performed to simply reset certain settings, time in State 1 may be brief (less than a first predetermined period). If power characteristics are not stable, time in State 1 may be greater than a second predetermined period to allow the power characteristics to settle.

The reaction module 84 can stop a fabrication process within the load 56 by disabling output power of the power generator 54 or may allow the fabrication process to continue when a shift and/or a low-level abnormality is detected. The fabrication process may be stopped to prevent damage to devices and/or substrates in the load 56. The fabrication process may be permitted to continue if, for example, stopping the fabrication process is controlled by the host control module 52 and/or is performed as a result of a manual input. The fabrication process may also be permitted to continue if, for example, the detected shift(s) and/or shift percentage(s) are less than respective predetermined levels, as not to constitute stopping the fabrication process. The reaction module 84 may generate warning signals via the user interface 72 when the fabrication process is not stopped and/or may stop the fabrication process if the shifts and/or shift percentages remain above predetermined levels for more than predetermined periods.

The algorithms of the shift detection module 82 and/or the reaction module 84 may perform real time statistical analysis of the detected power characteristics (i.e. analysis of the power characteristics upon detection of the power characteristics). The power characteristics may be associated with a single work piece (e.g., single substrate) in the load 56. The reaction module 84 determines an appropriate reaction based on the analysis. The generator control module 70 may transition from State 3 to State 1 when reaction tasks are completed. The transition from State 3 to State 1 is shown by arrow 166.

The above-described power generator systems 50, 100 of FIGS. 6-7 may be operated using numerous methods, an example method is provided by the methods of FIGS. 10A-10D. In FIGS. 10A-10D, a method of operating a power generator system is shown. Although the following tasks are primarily described with respect to the implementations of FIGS. 2-9, the tasks may be easily modified to apply to other implementations of the present disclosure. The tasks may be iteratively performed.

Although the following tasks are primarily performed based on changes in impedance, the tasks may be performed based on one or more power characteristics including, impedance, frequency, voltage, current, and/or other power characteristic. Also, although the following tasks are primarily described with respect to setting, detecting, monitoring, and reacting to changes in impedances, other power characteristics may be set, detected, and/or monitored. Reaction tasks may be performed in response to changes in the other power characteristics. Also, although the tasks are primarily described with respect to the power generator system 100 of FIG. 7, the tasks may be applied to the power generator system 50 of FIG. 6.

At 200, the generator control module 122 may be in State 0 with the power output 116 disabled. At 202, the generator control module 122 transitions to State 1 and the power output 116 is enabled. This may occur, for example, based on a request signal from the host control module 112. The power module 126 may determine whether the output power of the power generator 104 is enabled and generate a power signal indicating, for example, that the output power is enabled. State 1 and/or 2 may be performed based on the power signal.

The following tasks 204-221 may be associated with State 1. At 204, the generator control module 122 may determine whether a high-level abnormality (e.g., low-impedance arc event) is or has occurred based on signals from the sensors 110 and predetermined thresholds as described above and/or whether the high-abnormality has been cleared. Task 206 may be performed when the high-level abnormality has been cleared, otherwise task 236 may be performed.

At 206, the generator circuit 108 generates the output power to strike the primary plasma in the load 106 if the plasma is not already lit. At 208, the plasma module 124 determines whether the primary plasma is lit. This may include determining whether current supplied to the load 106 is greater than a predetermined threshold. If the current is greater than the predetermined threshold, then the primary plasma is lit. Task 210 is performed when the primary plasma is lit.

At 210, the stability module 130 may reset and/or increment a first counter. The first counter may be used to allow the power characteristics of the power generator 104 to settle to stable levels. At 212, the stability module 130 determines whether the first counter exceeds a first predetermined period. The first predetermined period may be associated with an amount of time for the power characteristics to stabilize. The first predetermined period may be fixed, programmable, and/or adjusted by the generator control module 122, the user interface 121, and/or host control module 112. The first predetermined period may be set to zero to minimize wait time. The first predetermined period may be decreased if the primary plasma is already lit at 206 and/or at 208. Tasks 210 and 212 may also provide a delay period after changes in one or more setpoint(s) during State 2. If the first counter has exceeded the first predetermined period, task 213 is performed, otherwise task 210 is performed.

At 213, the generator control module 122 determines whether to operate in and/or selects operation in an automatic mode (or baseline discover mode) or a manual mode. Task 214 is performed when operating in the baseline discover mode. Task 222 is performed when operating in the manual mode.

At 214, the stability module 130 obtains power characteristic sample(s), such as an impedance sample. One or more samples may be collected for each power characteristic being monitored. The power characteristic samples may be samples of sensor signals received from the sensors 110 and/or generated based on the sensor signals. The impedance, for example, may be: an impedance as seen by the power output 116 of the power generator 104; an impedance as seen by the output 118 of the matching network 102; and/or an input impedance of the load 106.

At 215, the stability module 130 may determine whether the sample(s) obtained at 214 are the same or within predetermined range(s) of corresponding last previously obtained sample(s). Task 217 may be performed when the sample(s) obtained are the same or within the predetermined range(s) of the last previously obtained sample(s), otherwise task 216 may be performed. Task 215 may be skipped and task 217 may be performed after task 214 if the sample obtained at 214 is a first sample.

At 216, the stability module 130 resets filter items of a first filter for stabilized baseline checks performed at 220. The filter items are used during, for example, tasks 214-220 to determine a baseline. The filter items may include: a sample counter, a time-based counter, a predetermined total number of samples for each monitored power characteristic to be taken; predetermined number(s) of successive samples for each monitored power characteristic that are the same or within respective predetermined range(s) for a baseline to be able to be determined; a second predetermined period used at 218; and/or other filter items used for baseline discovery. The filter items may be reset to zero, default values, and/or predetermined values.

At 217, the stability module 130 may reset and/or increment a second counter. The second counter may be used to assure that the power and/or impedance characteristic(s) monitored are stable. The second counter may be a sample counter or a time-based counter as shown.

At 218, the stability module 130 determines whether the second counter has exceeded a second predetermined period. The second predetermined period may be fixed, programmable, and/or adjusted by the generator control module 122, the user interface 121, and/or the host control module 112. This can allow the host control module 112 to control when State 2 is performed. The second predetermined period may be set to zero to minimize a number of samples taken and/or may be set to provide a predetermined number of samples for each of the power characteristics monitored and/or used to detect abnormalities. If the second predetermined period is exceeded, task 220 is performed, otherwise task 214 is performed.

Instead of performing tasks 217-218, the stability module 130 may determine whether (i) a total predetermined number of samples of each power characteristic and/or (ii) a predetermined number of successive samples having the same value or values within a predetermined range of each other have been taken. If a predetermined number of successive samples are the same or within a predetermined range for a power characteristic, task 220 may be performed, otherwise additional samples may be taken. The predetermined numbers of successive samples and the predetermined ranges may be fixed, programmable, and/or adjusted by the generator control module 122, the user interface 121, and/or the host control module 112. If (i) a total predetermined number of samples of one or more of the power characteristics have been taken and (ii) the predetermined number of corresponding successive samples having the same value or values within a predetermined range has not been satisfied, then a warning signal may be generated and/or the output power of the power generator 104 may be disabled.

At 220, the stability module 130 sets a baseline. This may include setting a baseline value for each of the power characteristics monitored. For example, if impedance is monitored, an impedance baseline is stored in the memory. The impedance baseline may be: the last impedance sample obtained at 214; an average of the impedance samples obtained at 214; an average of impedance samples obtained over the second predetermined period; or an average of the successive impedance samples having the same values or values within a predetermined range of each other.

At 221, the stability module 130 and/or the generator control module 122 resets and/or determines filter items of a second filter for power characteristic checks performed during State 2. The filter items for the second filter may include: a sample counter, time-based counter, a predetermined total number of samples to collect to identify a shift; a predetermined number of successive samples that are the same or within a predetermined range of each other and indicate a shift; a predetermined period in which to collect the samples; and/or other filter items used for low-level abnormality detection. The filter items may be reset to zero, default values, and/or predetermined values.

The host control module 112 may control when State 2 is performed. The host control module 112 may enable and/or disable operation in State 2 by transmitting scan signal to the generator control module 122 indicating whether to proceed to State 2. The generator control module 122 and/or the stability module 130 may remain in State 1 until the scan signal indicates that proceeding to State 2 is permitted.

At 222 and during the manual mode, the stability module 130 determines expected power characteristic(s). The Expected power characteristics may be used as the baseline and may be predetermined and stored in the memory 136, received via the user interface 121, and/or received from the host control module 112. Task 221 may be performed subsequent to task 222. Although not shown in FIG. 10B, tasks 217 and 218 or similar tasks may be performed between tasks 222 and 221.

The following tasks 223-234 may be associated with State 2. Although the following tasks are primarily described with respect to power characteristics being monitored and analyzed, other indices may be monitored and analyzed when performing the following described determinations. The other indices may include, for example, an auto-tuning match indices and an auto-frequency tuning indices. The auto-tuning indices may refer to an impedance of the matching network 102 or a matching network tuning output. This may be used, for example, when the sensors 110 are located between the power generator 104 and the matching network 102. The auto-frequency tuning indices may refer to the tuning of a frequency in the generator circuit 108.

At 223, the shift detection module 132 monitors one or more power characteristics, such as frequency, power, voltage, current and/or impedance. The power characteristics may be of: one or more power lines providing power from the power generator 104 to the load 106; of the matching network 102; of the input 120 of the load 106; and/or of electrodes in the load 106. The power characteristics to be monitored may be selected based on a regulation mode in which the power generator 104 is being operated. For example, if output power is being regulated, the output power may not be a characteristic being monitored. The power characteristics may be calculated and/or determined based on samples of the sensor signals. The power characteristics may be determined based on the filter items set at 221. In one implementation, impedance is monitored. Although the following tasks are described with respect to impedance, the tasks may be performed based on other power characteristics.

Although the following tasks 224-230 are shown as being performed in a particular order and as part of State 2, these tasks may be performed in a different order, during a different state (e.g., state 1) and/or at other points in time. At 224, the plasma module 124 and/or the shift detection module 132 determines whether the primary plasma is out (i.e. no longer lit). If the plasma is out, task 204 is performed, otherwise task 226 is performed.

At 226, the shift detection module 132 determines whether a setpoint has changed. An automatic change in a setpoint may have occurred via the generator control module 122 or a setpoint may have been manually changed via the user interface 121. A setpoint may also be changed via a request from the host control module 112. Task 204 is performed when a setpoint has changed, otherwise task 228 is performed.

At 228, the shift detection module 132 determines whether a request to rescan (redetect) the power characteristic(s) monitored or other request has been received from the generator control module 122, a module within the generator control module 122, the user interface 121, and/or the host control module 112. The received request may instruct the shift detection module 132 and/or the generator control module 122 to return to State 1. If the request is received, task 204 may be performed, otherwise task 230 may be performed.

At 230, the shift detection module 132 determines whether the output power of the power generator 104 is OFF. If the output power is OFF, task 202 is performed, otherwise task 231 is performed.

At 231, the shift detection module 132 may detect a shift in one or more of the power characteristic(s) monitored. A detected shift may be a positive shift or a negative shift. A shift may be detected based on the filter items reset and/or determined at 221. A shift may be detected, for example, when a power characteristic changes by a predetermined percentage and/or the power characteristic exceeds a predetermined threshold and/or limit. If a shift is detected, task 232 is performed, otherwise task 223 may be performed.

At 232, the shift detection module 132 determines whether high-level abnormality has occurred such that thresholds for a high-level abnormality have been exceeded. The thresholds and/or limits set for a high-level abnormality are greater than the thresholds and/or limits set for a low-level abnormality. If a high-level abnormality has occurred, task 236 is performed, otherwise task 234 is performed.

At 234, the shift detection module 132 determines whether a low-level abnormality has occurred. This may include multiple comparisons. The comparisons may include comparisons (i) between the baseline values determined during the baseline discover mode and actual (or measured) values or (ii) between expected values determined during the manual mode and the actual values.

For example, the shift detection module 132 may determine whether (i) a magnitude of a detected shift in a power characteristic (e.g., impedance) is greater than a first lower threshold X (associated with a low-level abnormality) and less than a first upper threshold Y (associated with a high-level abnormality) and/or (ii) a magnitude of a shift percentage or a change in shift percentage is greater than a second lower threshold N (associated with a low-level abnormality) and less than a second upper threshold M (associated with a high-level abnormality). N may be referred to as a deviation threshold indicating whether a low-level abnormality exists. If one or more of these comparisons are TRUE and/or indicate that a low-level abnormality has occurred, then task 246 may be performed, otherwise task 223 may be performed.

The following tasks 236-244 are tasks performed in the event of a high-level abnormality. At 236, the reaction module 134 may generate a warning signal indicating the high-level abnormality. The warning signal may be indicated to a user via the user interface 121 and/or may be transmitted to the host control module 112. The host control module 112 may perform tasks including countermeasures in response to the warning signal. The tasks may include, for example, shutting down the load 106 and/or changing or adjusting parameters of gas(es) entering and exiting the load 106.

At 238, the reaction module 134 may shutoff output power of the power generator 104. At 240, the reaction module 134 may reset and/or increment a third counter. The third counter may be used to allow the power characteristics of the power generator 104 to settle to stable levels and/or for the high-level abnormality to clear. At 242, the reaction module 134 determines whether the third counter exceeds a third predetermined period. The third predetermined period may be associated with: an amount of time for the power characteristics to stabilize; the power generator system 100 and/or load 106 to recover from the high-level abnormality; and/or for the high-level abnormality to clear. The third predetermined period may be fixed, programmable, and/or adjusted by the generator control module 122, the user interface 121, and/or the host control module 112. The third predetermined period may be set to zero to minimize wait time. If the third counter has exceeded the third predetermined period, task 244 is performed, otherwise task 240 is performed.

At 244, the reaction module 134 and/or the generator control module 122 may receive request to power ON (enable output power of) the power generator 104. This request may be received from the user interface 121 and/or the host control module 112. As an alternative, the request may be generated by the reaction module 134 and/or the generator control module 122. The reaction module 134 may enable power to the power generator 104 in response to the third counter being equal to and/or exceeding the third predetermined period. If the power generator 104 is to be powered ON, task 202 is performed.

The following tasks 246A-246M may be associated with State 3 and may be performed by the reaction module 134. At 246A, the reaction module 134 determines whether to handle the low-level abnormality as a high-level abnormality. This includes performing at least the tasks performed in association with a high-level abnormality. If TRUE, task 236 may be performed, otherwise task 246B may be performed.

At 246B, a determination is made as to whether the only reaction performed is generation of a warning signal. If TRUE, task 246C is performed to generate the warning signal. This may include indicating a warning via the user interface 121 and/or signaling the host control module 112. If the result of task 246B is FALSE, task 246D is performed.

At 246D, the warning signal is generated, as performed at 246C. At 246E, the reaction module 134 determines whether to power OFF the power generator 104. If the power generator 104 is not to be powered OFF, task 246F may be performed, otherwise task 246I may be performed.

At 246F, the reaction module 134 determines whether to adjust power characteristic(s) and/or setpoint(s) of parameters of the generator circuit 108. The parameters may include frequencies, power levels, voltages, current levels and/or impedances of points within the generator circuit 108 and/or downstream from the generator circuit 108.

At 246G, the power characteristic(s) and/or setpoint(s) may be adjusted to minimize and/or eliminate the low-level abnormality. This may include, for example, temporarily reducing the power, current and/or voltage supplied to the load and/or changing an operating state of the load to: a stable state; a state prior to the occurrence of the low-level abnormality; and/or a state in which a low-level abnormality does not exist. Task 204 may be performed subsequent to task 246G.

At 246H, other reaction tasks may be performed. The other reaction tasks may include, for example, waiting a fifth predetermined period for the low-level abnormality to subside. Task 223 may be performed subsequent to task 246H.

At 246I, the reaction module 134 may shutoff output power of the power generator 104. At 246J, the reaction module 134 determines whether to adjust power characteristic(s) and/or setpoint(s) of parameters of the generator circuit 108, as at 246F. Task 246K is performed when power characteristic(s) and/or setpoint(s) of parameters of the generator circuit 108 are adjusted, otherwise task 246L is performed. At 246K, the power characteristic(s) and/or setpoint(s) may be adjusted to minimize and/or eliminate the low-level abnormality, as at 246G.

At 246L, the reaction module 134 may reset and/or increment a fourth counter. The fourth counter may be used to allow the power characteristics of the power generator 104 to settle to stable levels and/or for the low-level abnormality to clear.

At 246M, the reaction module 134 determines whether the fourth counter exceeds a fourth predetermined period. The fourth predetermined period may be associated with: an amount of time for the power characteristics to stabilize; the power generator system 100 and/or load to recover from the low-level abnormality; and/or for the low-level abnormality to clear. The fourth predetermined period may be fixed, programmable, and/or adjusted by the generator control module 122, user interface 121, and/or host control module 112. The fourth predetermined period may be set to zero to minimize wait time. If the fourth counter has exceeded the fourth predetermined period, task 202 may be performed, otherwise task 246L is performed.

During States 1-3 when a low-level abnormality has cleared, a clear signal may be transmitted to the user interface 121 and/or the host control module 112 to indicate that the low-level abnormality has cleared. The generator control module 122 may wait until the low-level abnormality has cleared before returning to State 2.

Portions and/or all of the method of FIGS. 10A-10D and/or portions and/or all of associated algorithms may be disabled and/or enabled by the user interface 121 and/or the host control module 112.

The above-described tasks of FIGS. 10A-10D are meant to be illustrative examples; the tasks may be performed sequentially, synchronously, simultaneously, continuously, during overlapping time periods or in a different order depending upon the application. Also, any of the tasks may not be performed or skipped depending on the implementation and/or sequence of events.

In the above-described implementations, since the generator control module 122 monitors the power characteristics and reacts to changes in the power characteristics, quick reaction time is provided. The generator 122 control module is aware of specific events, such as setpoint changes, arc events, shifts in power characteristics and can react quickly to these events by adjusting output power setpoints, thresholds, and/or limits in the power generator 104. This minimizes power characteristic irregularities and/or load abnormalities.

The above-described implementations provide flexibility in system operation while preventing and reducing particle issues and high-level and low-level abnormalities. This prevention and reduction in abnormalities prevents damage to components and parts within a load and prevents inconstant material thicknesses of a part being worked on due to changes in plasma chamber impedances. The implementations improve product uniformity and fabrication process repeatability.

Example implementations are provided herein such that the disclosure is thorough, and fully conveys the scope to those who are skilled in the art. Numerous specific details are set forth such as examples of specific components, devices, and methods, to provide a thorough understanding of implementations of the present disclosure. It will be apparent to those skilled in the art that specific details need not be employed, that example implementations may be embodied in many different forms and that neither should be construed to limit the scope of the disclosure. In some example implementations, well-known processes, well-known device structures, and well-known technologies are not described in detail.

The terminology used herein is for the purpose of describing particular example implementations only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element is referred to as being "on," "engaged to," "connected to," or "coupled to" another element, it may be directly on, engaged, connected or coupled to the other element, or intervening elements may be present. In contrast, when an element is referred to as being "directly on," "directly engaged to," "directly connected to," or "directly coupled to" another element, there may be no intervening elements present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, and/or modules, these elements, components, and/or modules should not be limited by these terms. These terms may be only used to distinguish one element, component, or module from another element, component, or module. Terms such as "first," "second," and other numerical terms when used herein do not imply a sequence or order unless clearly indicated by the context. Thus, a first element, component, or module discussed below could be termed a second element, component, or module without departing from the teachings of the example implementations.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

As used herein, the term module may refer to, be part of, or include an Application Specific Integrated Circuit (ASIC); an electronic circuit; a combinational logic circuit; a field programmable gate array (FPGA); a processor (shared, dedicated, or group) that executes code; other suitable hardware components that provide the described functionality; or a combination of some or all of the above, such as in a system-on-chip. The term module may include memory (shared, dedicated, or group) that stores code executed by the processor.

The term code, as used above, may include software, firmware, and/or microcode, and may refer to programs, routines, functions, classes, and/or objects. The term shared, as used above, means that some or all code from multiple modules may be executed using a single (shared) processor. In addition, some or all code from multiple modules may be stored by a single (shared) memory. The term group, as used above, means that some or all code from a single module may be executed using a group of processors. In addition, some or all code from a single module may be stored using a group of memories.

The apparatuses and methods described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

The foregoing description of the implementations has been provided for purposes of illustration and description. It is not intended to be exhaustive or to limit the invention. Individual elements or features of a particular implementation are generally not limited to that particular implementation, but, where applicable, are interchangeable and can be used in a selected implementation, even if not specifically shown or described. The same may also be varied in many ways. Such variations are not to be regarded as a departure from the invention, and all such modifications are intended to be included within the scope of the invention.

What is claimed is:

1. A system comprising:
   a control module configured to receive a sensor signal indicating a power characteristic of an output power provided from a power generator to a load, wherein the load is separate from the control module and the power generator;
   a detection module configured to (i) detect a shift parameter of the power characteristic based on the sensor signal, and (ii) indicate whether the shift parameter has exceeded a threshold associated with a secondary plasma in the load; and
   a reaction module configured to indicate that a low-level abnormality exists in the load in response to the shift parameter exceeding the threshold.

2. The system of claim 1, wherein the shift parameter is a shift in the power characteristic or a shift percentage of the power characteristic.

3. The system of claim 1, wherein the power characteristic is an impedance detected at an output of the power generator or downstream from the power generator.

4. The system of claim 1, wherein:
   the load is a plasma chamber; and
   the power characteristic changes based on voltage and current supplied to electrodes in the plasma chamber.

5. The system of claim 1, wherein the second threshold corresponds to a low-impedance arc event.

6. The system of claim 1, wherein in the power generator is one of a radio frequency power generator, a direct current power generator, and an alternating current power generator.

7. The system of claim 1, wherein:
   the low-level abnormality corresponds to secondary plasma in the load; and the secondary plasma is not located within an area between electrodes of the load.

8. The system of claim 1, wherein the low-level abnormality includes a diversion in current from an electrode in the load to secondary plasma in the load.

9. The system of claim 1, further comprising:
a power module configured to determine whether output power of the power generator is enabled and generate a power signal; and
a stability module configured to determine whether the power characteristic is stable during a first state and based on the power signal,
wherein the detection module is configured to detect the shift parameter during a second state and subsequent to the stability module indicating that the power characteristic is stable.

10. The system of claim 9, wherein:
the control module is configured to transition from the second state to the first state in response to a change in a setpoint of the power generator; and
subsequent to the change in the setpoint,
the detection module is configured to temporarily cease monitoring the power characteristic, and
the stability module is configured to redetermine whether the power characteristic is stable.

11. The system of claim 1, wherein the detection module is configured to (i) monitor a length of time in which a shift in the power characteristic occurred, and (ii) detect the low-level abnormality based on the length of time.

12. The system of claim 1, wherein the detection module is configured to monitor a speed at which a shift in the power characteristic occurred, and (ii) detect the low-level abnormality based on the speed.

13. The system of claim 1, further comprising a stability module configured to (i) obtain samples of the power characteristic, (ii) determine whether the samples are at least one of equal to each other and within a predetermined range of each other, and (iii) determine a baseline based on the samples being at least one of equal to each other and within the predetermined range of each other,
wherein the detection module is configured to detect the shift parameter based on the baseline.

14. The system of claim 1, further comprising a stability module configured to (i) obtain samples of the power characteristic for a predetermined period, and (ii) determine a baseline based on a last predetermined number of the samples,
wherein the detection module is configured to detect the shift parameter based on the baseline.

15. The system of claim 1, further comprising a stability module configured to determine an expected value of the power characteristic,
wherein the detection module is configured to detect the shift parameter based on the expected value.

16. The system of claim 1, wherein the reaction module is configured to (i) perform a first series of tasks in response to the detection of the low-level abnormality, and (ii) perform a second series of tasks in response to detecting a high-level abnormality in the load,
wherein current drawn from the power generator due to the low-level abnormality is less than current drawn from the power generator due to the high-level abnormality.

17. The system of claim 1, wherein the reaction module is configured to adjust a setpoint corresponding to the output power in response to the detection of the low-level abnormality to clear the low-level abnormality.

18. The system of claim 17, wherein the reaction module is configured to maintain output power in an ON state in response to the detection of the low-level abnormality.

19. The system of claim 1, wherein the reaction module is configured to determine whether to disable the output power in response to the detection of the low-level abnormality.

20. The system of claim 1, wherein the reaction module is configured to adjust the power characteristic in response to the detection of the low-level abnormality to clear the low-level abnormality.

21. A power generator comprising:
the system of claim 1; and
a generator circuit configured to generate the output power to power the load and supply the output power from the power generator to the load.

22. A power generator system comprising:
the power generator of claim 21;
the load; and
a host control module configured to control operation of the power generator and the load.

23. The power generator system of claim 22, wherein:
the reaction module is configured to transmit a warning signal to the host control module;
the warning signal indicates detection of the low-level abnormality; and
the host control module is configured to adjust a setpoint of the generator circuit in response to the warning signal.

24. A power generator comprising:
a generator circuit configured to generate an output power to power a plasma chamber and supply the output power from the power generator to the plasma chamber;
a control module configured to receive a sensor signal indicating a power characteristic of the output power provided from the generator circuit to the plasma chamber;
a detection module configured to (i) detect a shift parameter of the power characteristic based on the sensor signal, and (ii) indicate whether the shift parameter has exceeded a threshold associated with secondary plasma in the plasma chamber; and
a reaction module configured to indicate that a low-level abnormality exists in the plasma chamber in response to the shift parameter exceeding the threshold.

25. The system of claim 1 wherein the threshold is further defined as a first threshold and the detection module is further configured to compare the shift parameter to the first threshold, and indicate whether the shift parameter has exceeded the first threshold and not a second threshold.

26. The system of claim 25, wherein:
a high-level abnormality exists in the load when the shift parameter exceeds the second threshold; and
current drawn by the load from the power generator is greater due to the high-level abnormality than current drawn by the load due to the low-level abnormality.

27. The system of claim 26, wherein the high-level abnormality includes a short.

28. The system of claim 25, wherein the shift detection module is configured to:
detect a high-level abnormality in the load based on the sensor signal;
detect the high-level abnormality in the load when the shift parameter exceeds the second threshold; and
a magnitude of the first threshold is less than a magnitude of the second threshold.

* * * * *